United States Patent
Li (10) Patent No.: US 10,401,695 B2
(45) Date of Patent: Sep. 3, 2019

(54) DISPLAY SUBSTRATE AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventor: Qingshuo Li, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

( * ) Notice: Subject to any disclaimer, the term of this patent is extended or adjusted under 35 U.S.C. 154(b) by 36 days.

(21) Appl. No.: 14/892,809

(22) PCT Filed: Apr. 20, 2015

(86) PCT No.: PCT/CN2015/076960
§ 371 (c)(1),
(2) Date: Nov. 20, 2015

(87) PCT Pub. No.: WO2016/107018
PCT Pub. Date: Jul. 7, 2016

(65) Prior Publication Data
US 2016/0357081 A1    Dec. 8, 2016

(30) Foreign Application Priority Data

Dec. 31, 2014    (CN) .......................... 2014 1 0853852

(51) Int. Cl.
*G02F 1/1362*    (2006.01)
*G02F 1/1333*    (2006.01)
(Continued)

(52) U.S. Cl.
CPC .. *G02F 1/136286* (2013.01); *G02F 1/133345* (2013.01); *G02F 1/133784* (2013.01);
(Continued)

(58) Field of Classification Search
CPC .................................................. G02F 1/136286
(Continued)

(56) References Cited

U.S. PATENT DOCUMENTS 7,671,953 B2 *    3/2010    Ha ..................... G02F 1/136286
                                                                349/139
7,787,095 B2 *    8/2010    Lim ..................... G02F 1/13458
                                                                349/145
(Continued)

FOREIGN PATENT DOCUMENTS

CN        101447490 A        6/2009
CN        101995713 A        3/2011
(Continued)

OTHER PUBLICATIONS

International Search Report and Written Opinion both dated Sep. 10, 2015; PCT/CN2015/076960.
(Continued)

*Primary Examiner* — Igwe U Anya
(74) *Attorney, Agent, or Firm* — Ladas & Parry LLP (57) ABSTRACT

A display substrate and a display device are provided. The display substrate includes: a base substrate; a first insulating layer arranged on the base substrate, at least one wire containing groove being provided on the first insulating layer; and at least one signal line, at least one of the signal lines being arranged in the wire containing groove, and one wire containing groove being configured to contain one signal line; and a second insulating layer, covering the first (Continued)

insulating layer and the signal line. The display device comprises the display substrate provided by the technical solution described above.

10 Claims, 7 Drawing Sheets

(51) Int. Cl.
    *G02F 1/1337*      (2006.01)
    *H01L 27/12*      (2006.01)
    *H01L 29/786*      (2006.01)

(52) U.S. Cl.
    CPC ........ *H01L 27/124* (2013.01); *H01L 27/1244* (2013.01); *H01L 27/1248* (2013.01); *H01L 27/1262* (2013.01); *H01L 29/78636* (2013.01)

(58) Field of Classification Search
    USPC .......................................................... 257/72
    See application file for complete search history.

(56) References Cited

U.S. PATENT DOCUMENTS

| | | | | |
|---|---|---|---|---|
| 9,391,097 | B2* | 7/2016 | Yuan | H01L 29/7869 |
| 9,817,287 | B2* | 11/2017 | Liu | H01L 27/1259 |
| 2003/0222311 | A1* | 12/2003 | Kim | G02F 1/13454 |
| | | | | 257/347 |
| 2005/0168135 | A1* | 8/2005 | Iga | H01L 27/3272 |
| | | | | 313/500 |
| 2009/0121228 | A1* | 5/2009 | Kim | G02F 1/13458 |
| | | | | 257/59 |
| 2009/0166635 | A1* | 7/2009 | Kim | H01L 27/1218 |
| | | | | 257/59 |
| 2009/0184324 | A1 | 7/2009 | Oh et al. | |
| 2010/0261322 | A1 | 10/2010 | Kim et al. | |
| 2011/0073864 | A1* | 3/2011 | Liu | H01L 33/08 |
| | | | | 257/59 |
| 2012/0050235 | A1* | 3/2012 | Park | H01L 27/3276 |
| | | | | 345/204 |
| 2013/0222033 | A1* | 8/2013 | Kato | G11C 7/04 |
| | | | | 327/214 |
| 2013/0248869 | A1* | 9/2013 | Chang | H01L 33/08 |
| | | | | 257/59 |
| 2013/0293595 | A1* | 11/2013 | Kim | G02F 1/13452 |
| | | | | 345/690 |
| 2014/0176853 | A1* | 6/2014 | Wang | G02F 1/133308 |
| | | | | 349/58 |
| 2014/0353690 | A1* | 12/2014 | Choi | H01L 27/1259 |
| | | | | 257/88 |
| 2015/0102353 | A1 | 4/2015 | Wang et al. | |
| 2015/0318304 | A1* | 11/2015 | Liu | H01L 27/1259 |
| | | | | 257/773 |
| 2016/0148957 | A1* | 5/2016 | Li | H01L 27/1262 |
| | | | | 257/72 |

FOREIGN PATENT DOCUMENTS

| | | |
|---|---|---|
| CN | 103969865 A | 8/2014 |
| CN | 204302629 U | 4/2015 |

OTHER PUBLICATIONS

First Chinese Office Action dated Dec. 5, 2016; Appln. No. 201410853852.5.
The Second Chinese Office Action dated Apr. 17, 2017; Appln. No. 201410853852.5.
The Third Chinese Office Action dated Sep. 12, 2017; Appln. 201410853852.5.

* cited by examiner

```
┌─────────────────────────────────────────────────────────────┐
│ Forming a first insulating layer on the base substrate, and │─ 201
│ forming a pattern including at least one wire containing    │
│ groove in the first insulating layer by one patterning      │
│ process                                                     │
└─────────────────────────────────────────────────────────────┘
                              ▼
┌─────────────────────────────────────────────────────────────┐
│ Forming a conductive layer on the first insulating layer    │─ 202
│ and the respective wire containing grooves, and forming a   │
│ pattern of one signal line in each of the wire containing   │
│ grooves by one patterning process                           │
└─────────────────────────────────────────────────────────────┘
                              ▼
┌─────────────────────────────────────────────────────────────┐
│ Forming a second insulating layer on the first insulating   │─ 203
│ layer and the plurality of signal lines                     │
└─────────────────────────────────────────────────────────────┘
```

DISPLAY SUBSTRATE AND DISPLAY DEVICE

TECHNICAL FIELD

Embodiments of the present invention relate to a display substrate and a display device.

BACKGROUND

Figure 1:
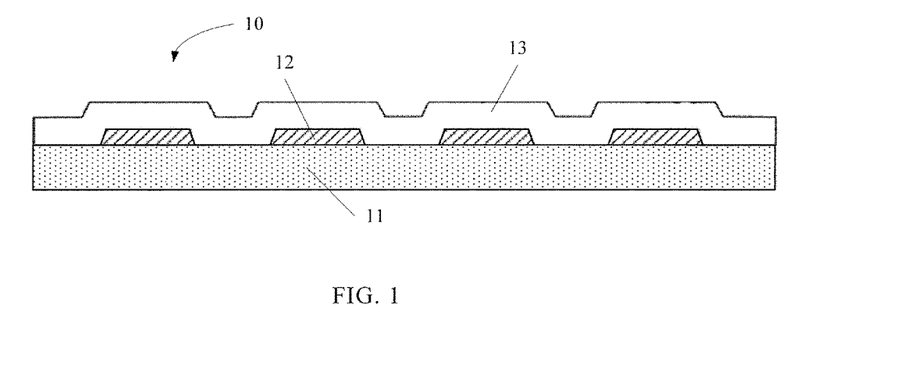
FIG. 1 is a structural schematic diagram of a known display substrate.

With development of display technology, a Thin Film Transistor (hereafter referred to as TFT) liquid crystal display device occupies a dominant position among current display devices. A display substrate plays an important role in many aspects of the TFT liquid crystal display device such as high response, high brightness, high contrast and so on; as shown in FIG. 1, a known display substrate 10 includes a base substrate 11, a signal line 12 arranged on the base substrate and an insulating layer 13 formed on the signal line.

However, inventors of the application have found that the known display substrate 10 has disadvantages as follows: because respective signal lines 12 are arranged on an upper surface of the base substrate 11, there are protrusions on the insulating layer 13 formed on the base substrate 11 and the respective signal lines 12; and when an external force is applied on the insulating layer 13, the insulating layer 13 is prone to be broken, so the signal line 12 may be easily corroded by electrolytic solution or water vapor, resulting in failure of the signal line. An alignment film on the display substrate at a position corresponding to the protrusion of the insulating layer 13 form a certain slope, so that there is a rubbing blind zone on the position during rubbing for alignment, and the blind zone may cause abnormal arrangement of liquid crystal molecules, resulting in light leakage in a liquid crystal screen.

SUMMARY

Embodiments of the invention provide a display substrate and a display device, to reduce a chance of failure of a signal line.

At least one embodiment of the invention provides a display substrate, comprising:

a base substrate;

a first insulating layer arranged on the base substrate, at least one wire containing groove being provided in the first insulating layer, and one or more signal lines, at least one of the signal lines being arranged in the wire containing groove, and one wire containing groove being configured to contain one signal line; and a second insulating layer, covering the first insulating layer and the signal line.

In one example, the display substrate comprises a peripheral wiring region and a display region.

In one example, the wire containing groove is located in the peripheral wiring region, the signal line includes a gate line or a data line.

In one example, the wire containing groove is located in the peripheral wiring region, the signal lines include a data line and a gate line, and the data line and the gate line are arranged on a same layer.

In one example, the wire containing groove is located in the peripheral wiring region, the signal lines include a data line and a gate line, and the data line and the gate line are arranged on different layers.

In one example, the data line and the gate line are arranged on different layers in manners as follows:

the first insulating layer includes a first sub-insulating layer and a second sub-insulating layer which are provided with at least one wire containing groove, respectively, and the second sub-insulating layer is located above the first sub-insulating layer, wherein, the data line is located in the wire containing groove of the first sub-insulating layer, and the gate line is located in the wire containing groove of the second sub-insulating layer;

or, the data line is located in the wire containing groove of the second sub-insulating layer, and the gate line is located in the wire containing groove of the first sub-insulating layer.

In one example, the wire containing groove is located in the display region, and the signal line includes a gate line or a data line.

In one example, the wire containing groove is located in the display region, and the signal lines include a gate line and a data line.

In one example, the wire containing groove is located in the display region, the signal lines include a data line and a gate line, and the data line and the gate line are arranged on different layers.

In one example, the data line and the gate line are arranged on different layers in manners as follows:

the first insulating layer includes a first sub-insulating layer and a second sub-insulating layer which are provided with at least one wire containing groove, respectively, and the second sub-insulating layer is located above the first sub-insulating layer, wherein, the data line is located in the wire containing groove of the first sub-insulating layer, and the gate line is located in the wire containing groove of the second sub-insulating layer;

or, the data line is located in the wire containing groove of the second sub-insulating layer, and the gate line is located in the wire containing groove of the first sub-insulating layer.

In one example, the first insulating layer is a silicon nitride layer or a silicon dioxide layer, or a combination layer including a silicon nitride layer and a silicon dioxide layer.

In one example, an upper surface of the signal line aligns with an upper surface of the first insulating layer.

At least one embodiment of the invention further provides a display device, comprising any display substrate described above.

BRIEF DESCRIPTION OF THE DRAWINGS

In order to make those ordinarily skilled in the art understand the disclosure more clearly, hereinafter, the embodiments of the disclosure will be further illustrated in detail in conjunction with the accompanying drawings, in which.

Reference signs: 10—display substrate, 11—base substrate, 12—signal line, 13—insulating layer, 14—wire containing groove, 15—gate line, 16—data line, 17—conductive layer, 131—first insulating layer, 132—second insulating layer, 1311—first sub—insulating layer, 1312—second sub-insulating layer, 1321—gate insulating layer, 1322—protective layer.

DETAILED DESCRIPTION

In order to make objects, technical details and advantages of the embodiments of the disclosure apparent, the technical solutions of the embodiments of the disclosure will be described in a clearly and fully understandable way in connection with the drawings of the embodiments of the disclosure. It is obvious that the described embodiments are just a part of exemplary embodiments, but not all of the embodiments of the disclosure. Based on the described exemplary embodiments of the disclosure, those ordinarily skilled in the art can obtain other embodiment(s), without any inventive work, which should be within the protective scope of the disclosure.

Unless otherwise defined, technical terms or scientific terms used herein have normal meanings capable of being understood by those of ordinary skill in the art of the disclosure. In the specification and claims of the present application for a patent for disclosure, words such as "first", "second" and the like do not denote any order, quantity or importance, but rather are used for distinguishing different components. Similarly, words such as "one", "a/an" or "the" or the like do not denote quantitative limitation, but rather indicate there is at least one. Words such as "include" or "comprise" and the like denote that elements or objects appearing before the words of "include" or "comprise" cover the elements or the objects enumerated after the words of "include" or "comprise" or equivalents thereof, not exclusive of other elements or objects. Words such as "up", "down" and the like are only used for expressing relative positional relationship, when the absolute position of the described object is changed, the relative position relationship may also be correspondingly changed.

Figure 2:
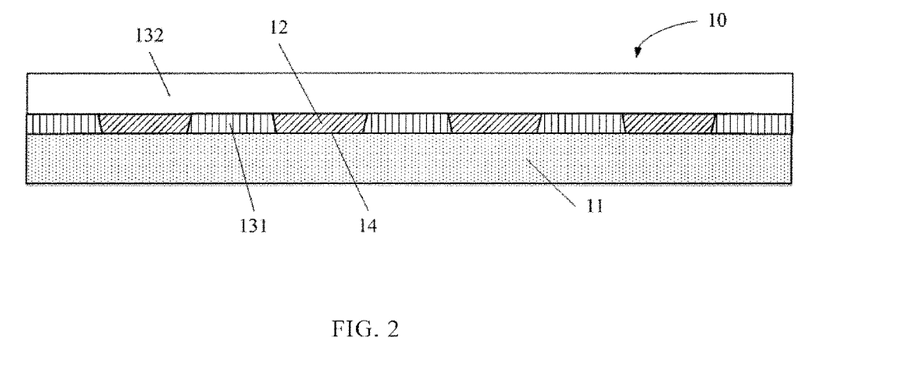
FIG. 2 is a structural schematic diagram I of a display substrate in an embodiment of the invention.

Please refer to FIG. 2, a display substrate 10 provided by an embodiment of the invention includes: a base substrate 11, a first insulating layer 131 arranged on the base substrate 11, at least one first wire containing groove 14 being provided on the first insulating layer 131; at least one signal line 12, and a second insulating layer 132 covering the first insulating layer 131 and the signal line 12; wherein, at least one of the signal lines 12 is arranged in the wire containing groove 14, and one wire containing groove 14 is used for containing one signal line 12.

Figure 3:
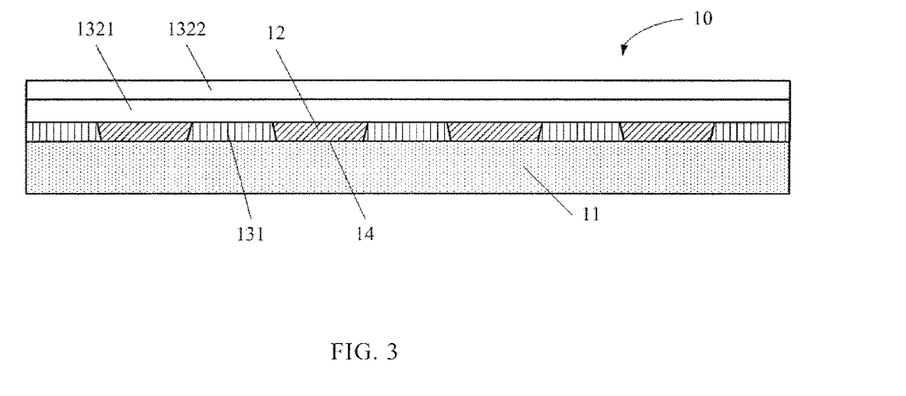
FIG. 3 is a structural schematic diagram II of the display substrate in the embodiment of the invention.

In one example, the base substrate 11 may be a glass substrate or a plastic substrate; the first insulating layer 131 may be an insulating light-transmitting material layer, the second insulating layer 132 may be of a single-layer structure, or of a dual-layer structure, for example: as shown in FIG. 3, the second insulating layer 132 is of a dual-layer structure, including a gate insulating layer 1321 located below, and a protective layer (PVX layer) 1322 located above; wherein, the gate insulating layer 1321 may be, for example, a silicon nitride layer. The number of signal lines 12 is determined by function and structure of the display substrate; in the embodiment of the disclosure, there are a plurality of signal lines 12, and the plurality of signal lines 12 may all be arranged in respective wire containing grooves 14, or only part of the signal lines 12 are arranged in the respective wire containing grooves 14, but it should be noted that, in any case, one wire containing groove 14 is provided with only one signal line 12.

In the display substrate provided by the embodiment described above, all or part of the signal lines 12 are arranged in corresponding wire containing grooves 14, so an upper surface of the second insulating layer 132 formed on the first insulating layer 131 and the signal line 12 is prone to be flat, and the upper surface of the display substrate 10 is prone to be flat, to reduce a chance of damage to the second insulating layer 132 located above the signal line 12, and further reduce a chance of failure of the signal line 12. Furthermore, when an alignment film of the display substrate 10 is rubbed, rubbing blind zones caused by protrusions having slopes on an upper surface of the display substrate 10 are reduced, so that a rubbing cloth and the alignment film can get full contact with each other, to make the alignment film perform a normal alignment, and make liquid crystal molecules arranged properly, thus reducing a chance of light leakage in a display device.

In one example, the display substrate may be divided into a peripheral wiring region and a display region, the wire containing groove 14 is located in the peripheral wiring region and/or the display region, and the signal line may be a gate line and/or a data line specifically. For example, in the peripheral wiring region on the base substrate 11, the first insulating layer 131 is a buffer layer, a position of the wire containing groove 14 corresponds to the peripheral wiring region on the base substrate 11, and the signal line 12 is a gate line and/or a data line; for example, a plurality of wire containing grooves 14 are arranged at intervals on the buffer layer, each wire containing groove 14 is provided with one signal line, and the signal line may be a gate line or a data line. Since the buffer layer is made of an insulating light-transmitting material, respective signal lines can be isolated by using the buffer layer to prevent mutual signal interference. It should be noted that, the first insulating layer may be specifically selected from a silicon nitride layer, a silicon dioxide layer, or a combination layer including a silicon nitride layer and a silicon dioxide layer.

Figure 4:
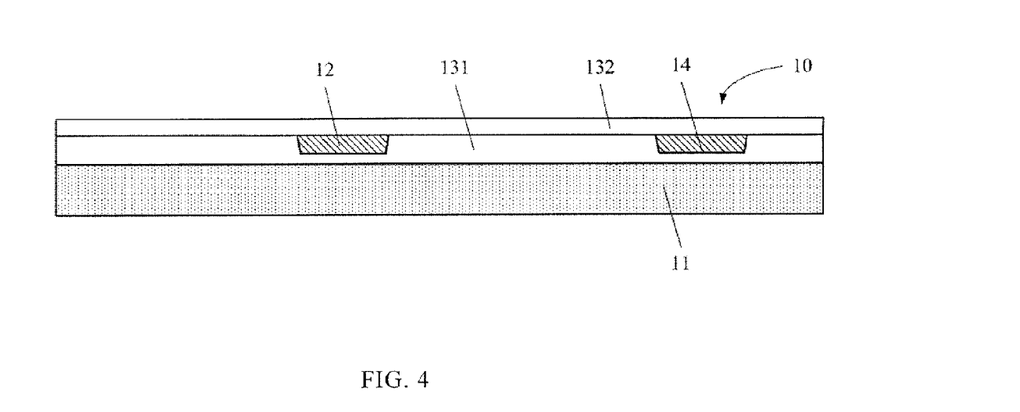
FIG. 4 is a structural schematic diagram III of the display substrate in the embodiment of the invention.

In one example, in order to prevent a protrusion from appearing in a region of an upper surface of the display substrate 10 corresponding to the respective signal lines 12, for example, an upper surface of the signal line 12 aligns with an upper surface of the first insulating layer 131, that is, an upper surface of the gate line or an upper surface of the data line aligns with the upper surface of the first insulating layer. Please refer to FIG. 2, when the signal line 12 is a gate line, the first insulating layer 131 is a buffer layer, and the upper surface of the gate line aligns with the upper surface of the buffer layer. Or, please refer to FIG. 4, when the signal line 12 is a data line, the first insulating layer 131 is a gate insulating layer, and the upper surface of the data line aligns with the upper surface of the gate insulating layer. Therefore, an upper surface of the second insulating layer 132 formed above the gate line or the data line and the first insulating layer 131 is flat, so that the upper surface of the display substrate 10 is also flat, to avoid damage to the second insulating layer 132 located above the gate line or the data line, and further reduce a chance of failure of the gate line or the data line; and reduce rubbing blind zones on the upper surface of the display substrate 10, thus reducing a chance of light leakage in a display device.

Figure 5:
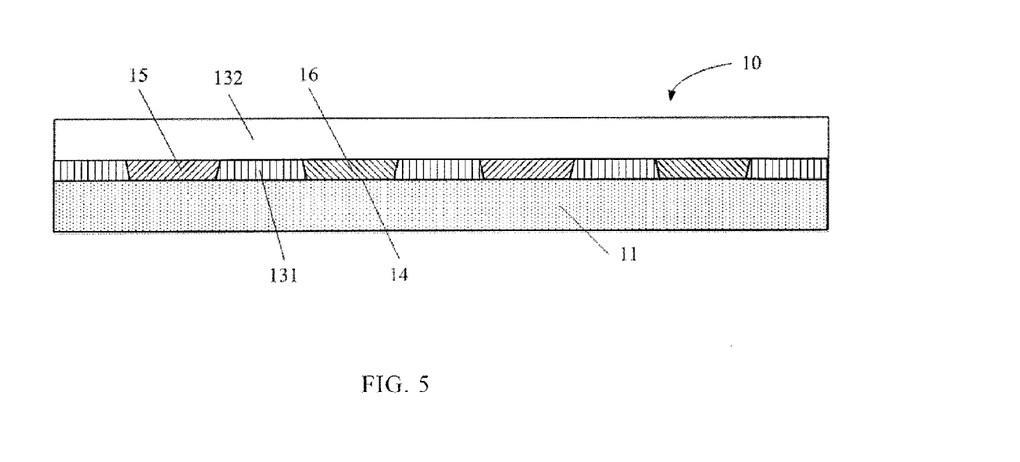
FIG. 5 is a structural schematic diagram IV of the display substrate in the embodiment of the invention.
Figure 6:
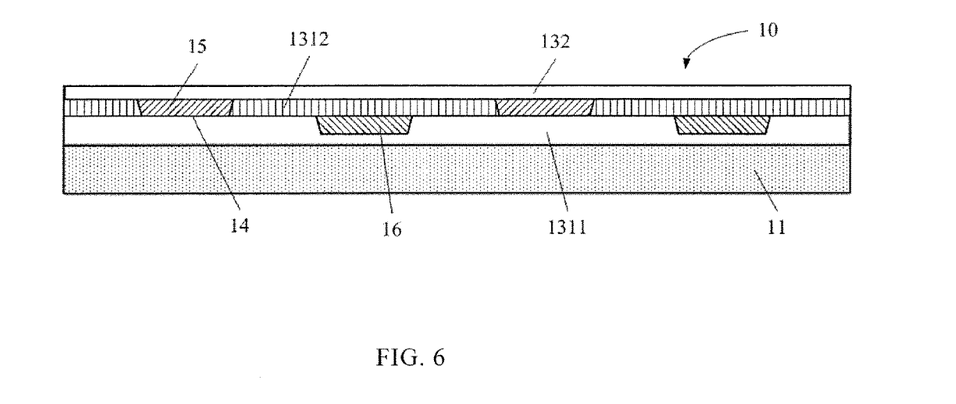
FIG. 6 is a structural schematic diagram V of the display substrate in the embodiment of the invention.
Figure 7:
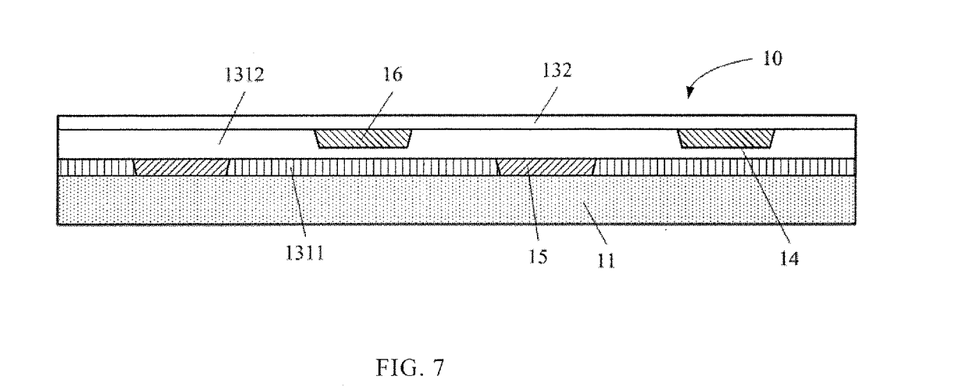
FIG. 7 is a structural schematic diagram VI of the display substrate in the embodiment of the invention.

In the display substrate 10 provided by the embodiment described above, the signal line 12 arranged in the peripheral wiring region is a gate line or a data line. However, the disclosure is not limited thereto, the signal lines 12 arranged in the peripheral wiring region 12 may be both a gate line 15 and a data line 16, wherein, the gate line 15 and the data line 16 may be arranged on the same layer as shown in FIG. 5, or may be arranged on different layers as shown in FIG. 6 or FIG. 7. When the gate line 15 and the data line 16 are arranged on different layers, the first insulating layer 131 includes a first sub-insulating layer 1311 and a second sub-insulating layer 1312 which are provided with at least one wire containing groove 14 respectively, and the second sub-insulating layer 1312 is located above the first sub-insulating layer 1311; for example: please refer to FIG. 6, the data line 16 is located in the wire containing groove 14 of the first sub-insulating layer 1311, the gate line 15 is located in the wire containing groove 14 of the second sub-insulating layer 1312, and the second insulating layer 132 covers the second sub-insulating layer 1312 and the gate line 15; or, please refer to FIG. 7, the data line 16 is located in the wire containing groove 14 of the second sub-insulating layer 1312, the gate line 15 is located in the wire containing groove 14 of the first sub-insulating layer 1311, and the second insulating layer 132 covers the second sub-insulating layer 1312 and the data line 16.

Since wire containing grooves 14 are arranged in the first sub-insulating layer 1311 and the second sub-insulating layer 1312, and the gate line 15 and the data line 16 are located in the wire containing grooves 14 of corresponding sub-insulating layers, the second insulating layer 132 formed on the second sub-insulating layer and the signal line 12 is prone to be flat, so that an upper surface of the display substrate 10 is relatively flat, to avoid damage to the second insulating layer 132 located above the gate line 15 and the data line 16, and further reduce a chance of failure of the gate line 15 and the data line 16.

In one example, in order to prevent a protrusion from appearing in a region of an upper surface of the display substrate 10 corresponding to respective data lines 16, for example, when the data line 16 is located in the wire containing groove 14 of the first sub-insulating layer 1311 and the gate line 15 is located in the wire containing groove 14 of the second sub-insulating layer 1312, an upper surface of the data line 16 aligns with the upper surface of the first sub-insulating layer 1311, and the upper surface of the gate line 15 aligns with the upper surface of the second sub-insulating layer 1312; when the data line 16 is located in the wire containing groove 14 of the second sub-insulating layer 1312 and the gate line 15 is located in the wire containing groove 14 of the first sub-insulating layer 1311, an upper surface of the gate line 15 aligns with the upper surface of the first sub-insulating layer 1311, and the upper surface of the data line 16 aligns with the upper surface of the second sub-insulating layer 1312. Therefore, an upper surface of the second insulating layer 132 formed above the signal line 12 and the first insulating layer is flat, so that the upper surface of the display substrate 10 is also flat, to avoid damage to the second insulating layer 132 located above the gate line 15 and the data line 16, and further reduce a chance of failure of the gate line 15 and the data line 16.

Figure 8:
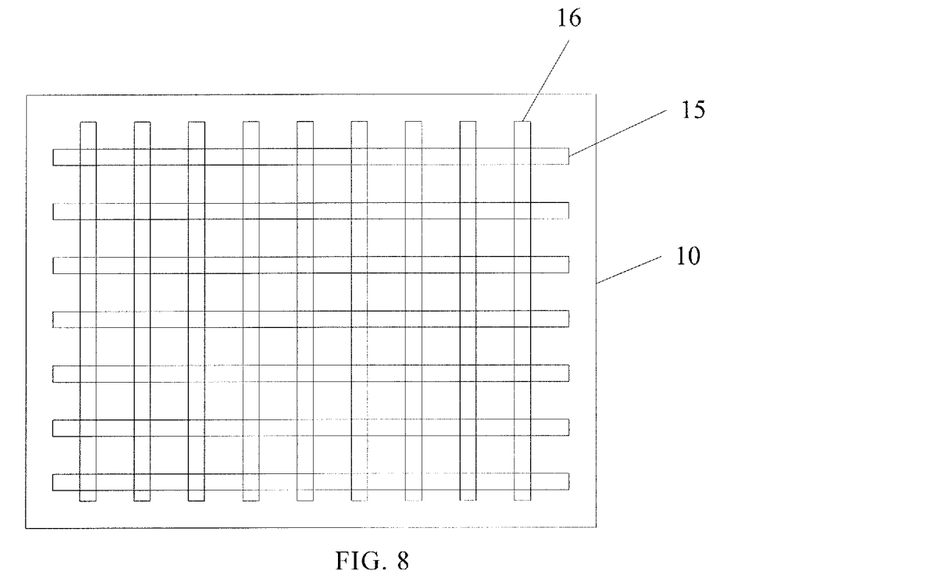
FIG. 8 is an arrangement schematic diagram of signal lines in a display region of the display substrate in the embodiment of the invention.

The wire containing groove 14 of the display substrate 10 provided by the embodiment described above may be further located in a display region, and the signal line 12 includes the data line 16 or the gate line 15; or, as shown in FIG. 8, the signal line 12 includes the data line 16 and the gate line 15 which are arranged on different layers, the gate line 15 and the data line 16 crisscross each other, and an included angle between projections of the gate line 15 and the data line 16 is 90°; the first insulating layer 131 includes a first sub-insulating layer 1311 and a second sub-insulating layer 1312 which are provided with at least one wire containing groove 14 respectively, and the second sub-insulating layer 1312 is located above the first sub-insulating layer 1311, wherein, the data line 16 is located in the wire containing groove 14 of the first sub-insulating layer 1311, and the gate line 15 is located in the wire containing groove 14 of the second sub-insulating layer 1312; or, the data line 16 is located in the wire containing groove 14 of the second sub-insulating layer 1312, and the gate line 15 is located in the wire containing groove 14 of the first sub-insulating layer 1311.

It should be noted that the display panel 10 in the embodiment described above may be a substrate provided with signal lines such as an array substrate, a color filter substrate, a touch substrate and the like. In addition to a data line and/or a gate line as described above, the signal line may be a lead which can transmit signals such as a power line, a common electrode line, a touch scanning line or a touch sensing line and so on.

Figure 9:
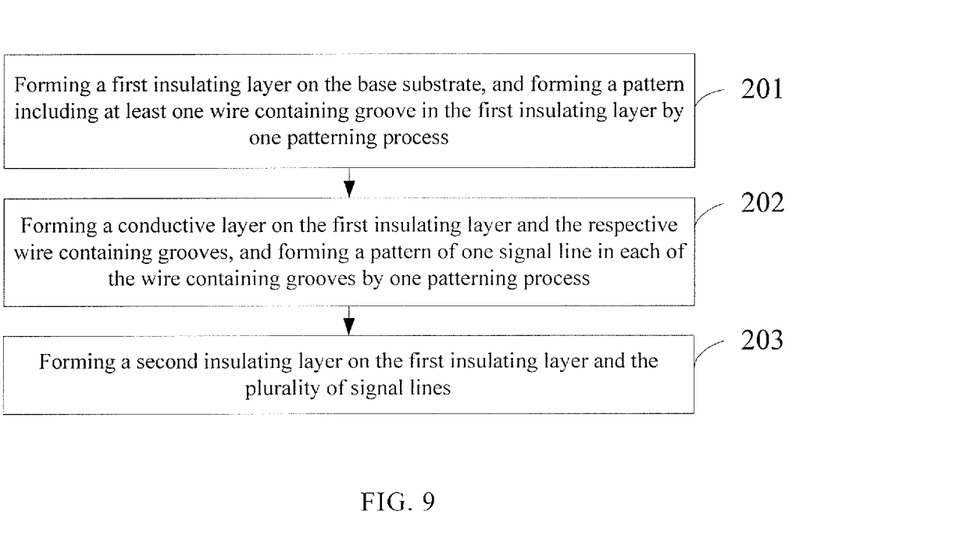
FIG. 9 is a flow chart of a fabrication method of the display substrate in the embodiment of the invention.
Figure 10A:
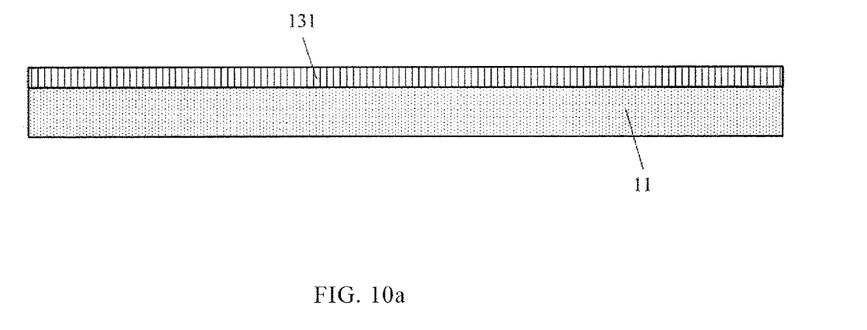
FIG. 10a, FIG. 10b, FIG. 10c, FIG. 10d and FIG. 10e are schematic diagrams of a fabrication process of the display substrate in the embodiment of the invention.
Figure 10B:
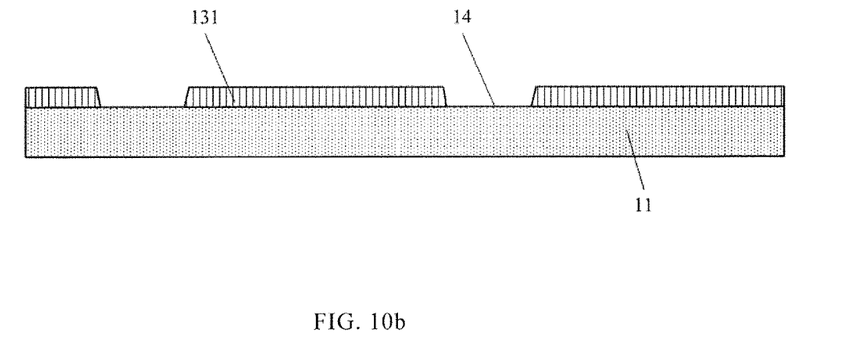

Please refer to FIG. 9, an embodiment of the invention provides a fabrication method of the display substrate 10, comprising:

Step 201: forming a first insulating layer 131 on a base substrate 11, and forming a pattern including at least one wire containing groove 14 on the first insulating layer 131 by one patterning process. Please refer to FIG. 10a and FIG. 10b for an exemplary fabrication process of step 201; as shown in FIG. 10a, a layer of the first insulating layer 131 is formed on the base substrate 11; and then, as shown in FIG. 10b, a pattern including at least one wire containing groove 14 is formed in the first insulating layer 131 by a patterning process such as developing, etching and so on. A depth of a wire containing groove may be the same as a thickness of a first insulating layer, or less than the thickness of the first insulating layer. It should be noted that, the first insulating layer 131 may select a silicon nitride layer or a silicon dioxide layer, or a combination layer including a silicon nitride layer and a silicon dioxide layer.

Figure 10C:
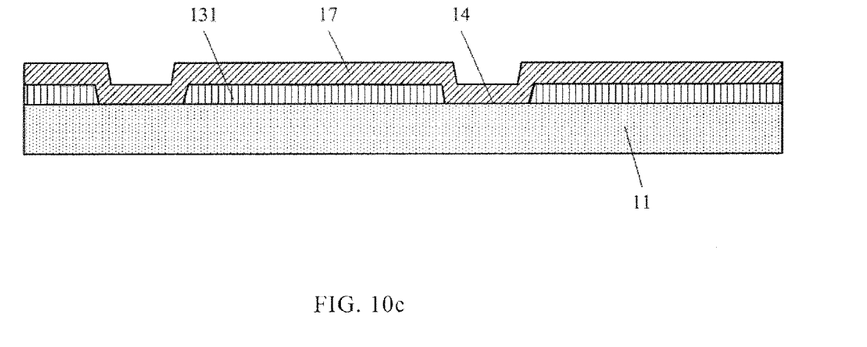
Figure 10D:
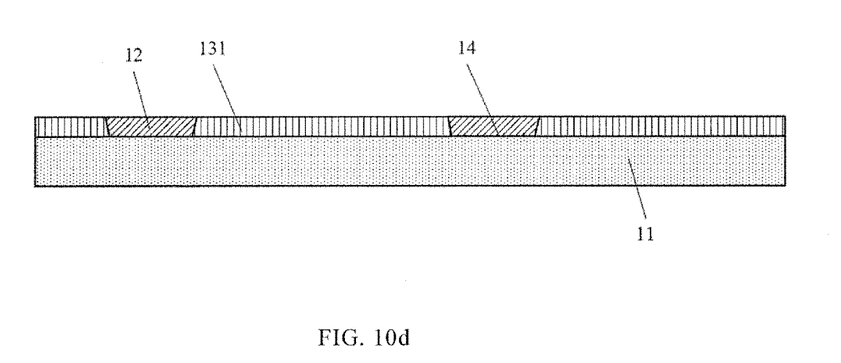

Step 202: forming a conductive layer 17 on the first insulating layer 131 and the respective wire containing grooves 14, and forming a pattern of one signal line 12 in each of the wire containing grooves 14 by one patterning process. Please refer to FIG. 10c and FIG. 10d for an exemplary fabrication process of step 202; as shown in FIG. 10c, a conductive layer 17 is formed on the remained first insulating layer 131 and the wire containing groove 14 which have been etched in step 201, wherein the conductive layer may be a metal layer or a conductive glass layer or the like; and then, as shown in FIG. 10d, one signal line 12 is formed in each wire containing groove 14 by a patterning process such as developing, etching and so on, and the signal line 12 is a remained part of the conductive layer 17 which has been etched. For example, an upper surface of the signal line aligns with the upper surface of the first insulating layer, to further reduce damage to the second insulating layer located above the signal line, and further reduce a chance of failure of the signal line.

Figure 10E:
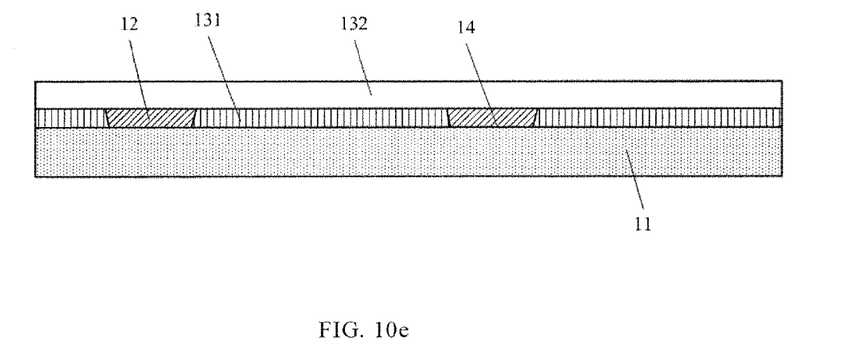

Step 203: forming a second insulating layer 132 on the first insulating layer 131 and the plurality of signal lines 12. Please refer to FIG. 10e for an exemplary fabrication process of step 203, and a second insulating layer 132 is formed on the first insulating layer 131 and the plurality of signal lines 12.

In the fabrication method of the display substrate 10 provided by the embodiment of the disclosure, because a wire containing groove 14 is arranged in the first insulating layer 131 corresponding to the signal line 12, at least one of the signal lines 12 is located in the wire containing groove 14, and one wire containing groove 14 only contains one signal line 12, so that the second insulating layer 132 formed on the first insulating layer 131 and the respective signal lines 12 is prone to be flat, and an upper surface of the display substrate 10 is also prone to be flat, to avoid damage to the second insulating layer 132 located above the signal line 12, and further reduce a chance of failure of the signal line 12.

Figure 11:
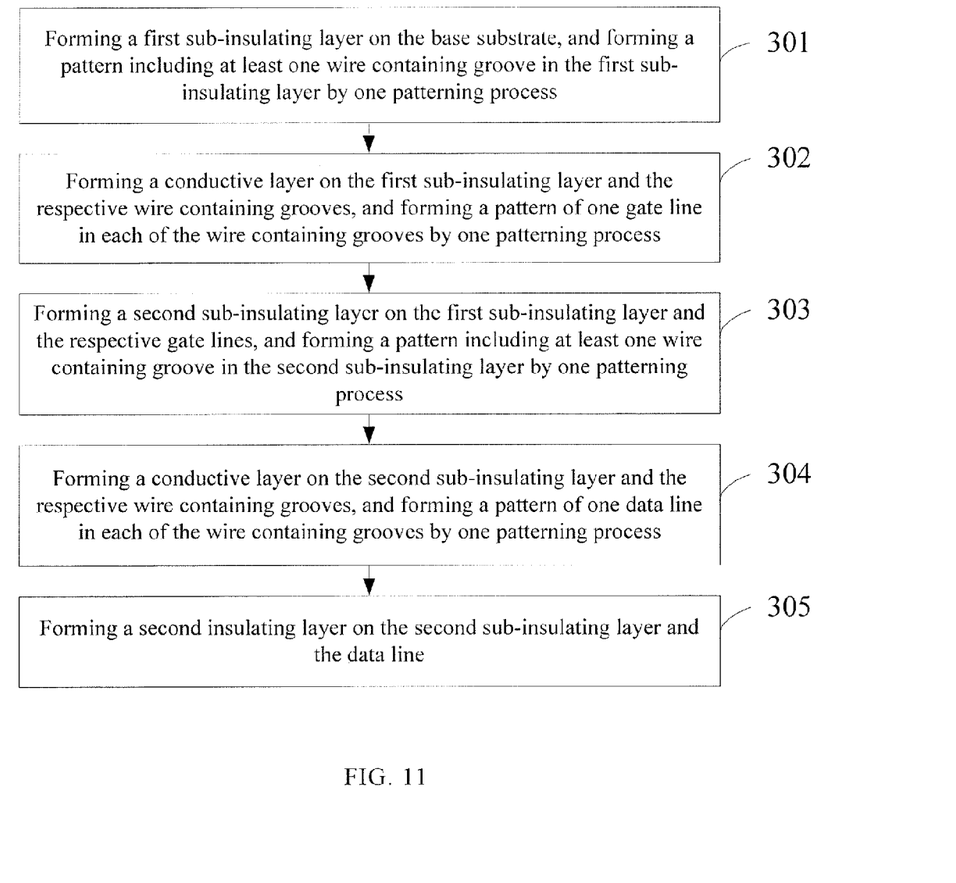
FIG. 11 is a flow chart of another fabrication method of the display substrate in the embodiment of the invention.

Furthermore, in one example, the display substrate 10 may be divided into a peripheral wiring region and a display region according to display function, wherein, a fabrication method of the peripheral wiring region is similar to that of the display region; hereinafter, the fabrication method of the display substrate 10 is described by taking an example that the signal lines are a gate line and a data line, the first insulating layer includes a first sub-insulating layer and a second sub-insulating layer, the gate line and the data line are arranged on different layers, and the date line is located above the gate line; please refer to FIG. 11, the example of the fabrication method of the display substrate 10 includes:

Step 301: forming a first sub-insulating layer 1311 on a base substrate 11, and forming a pattern including at least one wire containing groove 14 on the first sub-insulating layer 1311 by one patterning process;

Step 302: forming a conductive layer 17 on the first sub-insulating layer 1311 and the respective wire containing grooves 14, and forming a pattern of one gate line 15 in the respective wire containing grooves 14 by one patterning process;

Step 303: forming a second sub-insulating layer 1312 on the first sub-insulating layer 1311 and the respective gate lines 15, and forming a pattern including at least one wire containing groove 14 on the second sub-insulating layer 1312 by one patterning process;

Step 304: forming a conductive layer 17 on the second sub-insulating layer 1312 and the respective wire containing grooves 14, and forming a pattern of one data line 16 in the respective wire containing grooves 14 by one patterning process;

Step 305: forming a second insulating layer 132 on the second sub-insulating layer 1312 and the data line 16.

Specific manners of patterning processes in step 301 to step 305 may refer to specific contents of step 201 to step 203, which will not be repeated here.

In the example, since the signal lines 12 are a gate line 15 and a data line 16, a wire containing groove 14 is arranged in the first sub-insulating layer 1311 corresponding to the gate line 15, one gate line 15 is located in one wire containing groove 14, and a wire containing groove 14 is arranged in the second sub-insulating layer 1312 corresponding to the data line 16, one data line 16 is located in one wire containing groove 14, so that the second insulating layer 132 formed above the first sub-insulating layer 1311, the gate line 15, the second sub-insulating layer 1312 and the data line 16 is prone to be flat, and an upper surface of the display substrate 10 is relatively flat, to avoid damage to the second insulating layer 132 located above the gate line 15 and the data line 16, and further reduce a chance of failure to the gate line 15 and the data line 16; meanwhile, because rubbing blind zones caused by protrusions having slopes are reduced, a chance of light leakage in a display region of the liquid crystal screen is reduced, too.

An embodiment of the invention further provides a display device, including the display substrate provided by any embodiments as mentioned above. The display device can be any product or component having a display function, such as a liquid crystal display panel, electronic paper, a mobile phone, a tablet PC, a TV, a liquid crystal display device, a laptop computer, a digital photo frame, a navigator, etc.

In descriptions of the implementation modes, specific features, structures, materials or characteristics may be combined in an applicable way in any one or a plurality of embodiments or examples.

The above implementation modes are only related to the description of the disclosure and thus are not limitative of the disclosure. Those of ordinary skill in the art may obtain other various changes and modifications, without departing from the scope and spirit of the disclosure, which should be within the scope of the disclosure, and the scope of the disclosure should be defined by the appended claims The present application claims priority of Chinese Patent Application No. 201410853852.5, entitled "Display Substrate and Display Device" and filed on Dec. 31, 2014, the disclosure of which is incorporated herein by reference in its entirety as part of the present application.

The invention claimed is:

1. A display substrate, comprising:
a base substrate;
a first insulating layer arranged on the base substrate, at least one wire containing groove being provided in the first insulating layer;
one or more signal lines, at least one of the signal lines being arranged in the wire containing groove, and one wire containing groove being configured to contain one signal line; and
a second insulating layer, covering the first insulating layer and the signal line,
wherein, the display substrate comprises a peripheral wiring region and a display region,
wherein, the wire containing groove is located in the peripheral wiring region, and the signal lines include a gate line and a data line,
wherein, a part of the data line and a part of the gate line, which are located in the peripheral wiring region, are arranged on a same layer,
wherein both the data line and the gate line are disposed in the at least one wire containing groove.

2. The display substrate according to claim 1, wherein, the first insulating layer is a silicon nitride layer or a silicon dioxide layer, or a combination layer including a silicon nitride layer and a silicon dioxide layer.

3. The display substrate according to claim 1, wherein, an upper surface of the signal line aligns with an upper surface of the first insulating layer.

4. The display substrate according to claim 1, wherein a part of the gate line and a part of the data line, which are located in the display region, are arranged on different layers.

5. A display device, comprising the display substrate, wherein the display substrate comprises:
- a base substrate;
- a first insulating layer arranged on the base substrate, at least one wire containing groove being provided in the first insulating layer;
- one or more signal lines, at least one of the signal lines being arranged in the wire containing groove, and one wire containing groove being configured to contain one signal line; and
- a second insulating layer, covering the first insulating layer and the signal line,
- wherein, the display substrate comprises a peripheral wiring region and a display region,
- wherein, the wire containing groove is located in the peripheral wiring region, and the signal lines include a gate line and a data line,
- wherein, a part of the data line and a part of the gate line, which are located in the peripheral wiring region, are arranged on a same layer,
- wherein both the data line and the gate line are disposed in the at least one wire containing groove.

6. The display device according to claim 5, wherein, the wire containing groove is located in the peripheral wiring region, and the signal line includes a data line or a gate line.

7. The display device according to claim 5, wherein, the data line and the gate line are arranged on a same layer.

8. The display device according to claim 5, wherein, the data line and the gate line are arranged on different layers.

9. The display device according to claim 8, wherein, the first insulating layer includes a first sub-insulating layer and a second sub-insulating layer which are provided with at least one wire containing groove, respectively, and the second sub-insulating layer is located above the first sub-insulating layer, wherein,
- the data line is located in the wire containing groove of the first sub-insulating layer, and the gate line is located in the wire containing groove of the second sub-insulating layer;
- or, the data line is located in the wire containing groove of the second sub-insulating layer, and the gate line is located in the wire containing groove of the first sub-insulating layer.

10. The display device according to claim 5, wherein a part of the gate line and a part of the data line, which are located in the display region, are arranged on different layers.

* * * * *